United States Patent [19]
Sharp et al.

[11] Patent Number: 5,173,338
[45] Date of Patent: Dec. 22, 1992

[54] LEAD FRAME WORKHOLDER AND TRANSPORT APPARATUS AND METHOD

[75] Inventors: James B. Sharp, Duncanville; Roy Booth, Randolph; Max Havenhill, Irving, all of Tex.

[73] Assignee: AK Technology, Inc., Dallas, Tex.

[21] Appl. No.: 680,340

[22] Filed: Apr. 4, 1991

[51] Int. Cl.⁵ .................... B05D 5/00; B05C 9/00; B05C 13/02
[52] U.S. Cl. ..................... 427/287; 118/697; 118/704; 118/705; 118/706
[58] Field of Search ........ 118/669, 697, 687, 704–706; 198/345.1, 740, 465.1, 465.2; 29/741, 759; 427/96, 287

[56] References Cited

U.S. PATENT DOCUMENTS

4,516,673  5/1985  Kashihara et al. ........... 198/345.1 X
4,624,358  11/1986  Satou ........................ 198/345.1
4,958,722  9/1990  Kobayashi et al. ........... 198/740 X Primary Examiner—Evan Lawrence
Attorney, Agent, or Firm—John F. A. Earley; John F. A. Earley, III

[57] ABSTRACT

Lead frame workholder and transport apparatus for holding and transporting a strip of lead frames from one station to another, each lead frame having a pad and a locating pinhole, comprises a track having an input station at one end and an output station at the other end with an application station in between, a vacuum loader for loading a strip of lead frames onto the input station, a first transporter for contacting the lead frame strip in the input station by inserting a pin into the locating pinhole and moving the strip along the track to the application station, and a second transporter for moving the strip to the output station and into an exit carrier. A method of applying an epoxy layer to the pads of a strip of lead frames using the apparatus is disclosed.

8 Claims, 8 Drawing Sheets

LEAD FRAME WORKHOLDER AND TRANSPORT APPARATUS AND METHOD

BACKGROUND OF THE INVENTION

This invention relates to a lead frame workholder and transport apparatus for holding and moving a strip of semiconductor lead frames from an inlet station to an application station as in a die bonder for bonding dies or chips to lead frames in the field of semiconductor devices, and more particularly concerns a lead frame workholder for holding and transporting a strip of lead frames from a stack in an inlet station to an epoxy station for applying a layer of epoxy to the pads of the lead frames and for transporting the epoxied lead frames to a die bonding station for applying a die to the epoxy layer. The invention also includes a method of using the apparatus.

A lead frame is a stamped metal frame having leads extending inwardly and outwardly from a frame and having a central pad on which an integrated circuit chip or die is mounted and used in the semiconductor industry. There are many different sizes of lead frames with different widths, different lengths, and different numbers of leads extending from the frame. To mount a die on the pad of a lead frame, a workholder is used to hold a strip of lead frames, typically with five or eight mounting pads, but it can have any number, while it is being transported from an input station to an epoxy station where an epoxy layer is applied to the pad of each lead frame, and to a die bonding station where a die is applied to each adhesive layer to form a die bonded lead frame which is later processed into a desired integrated circuit package.

Figure 1:
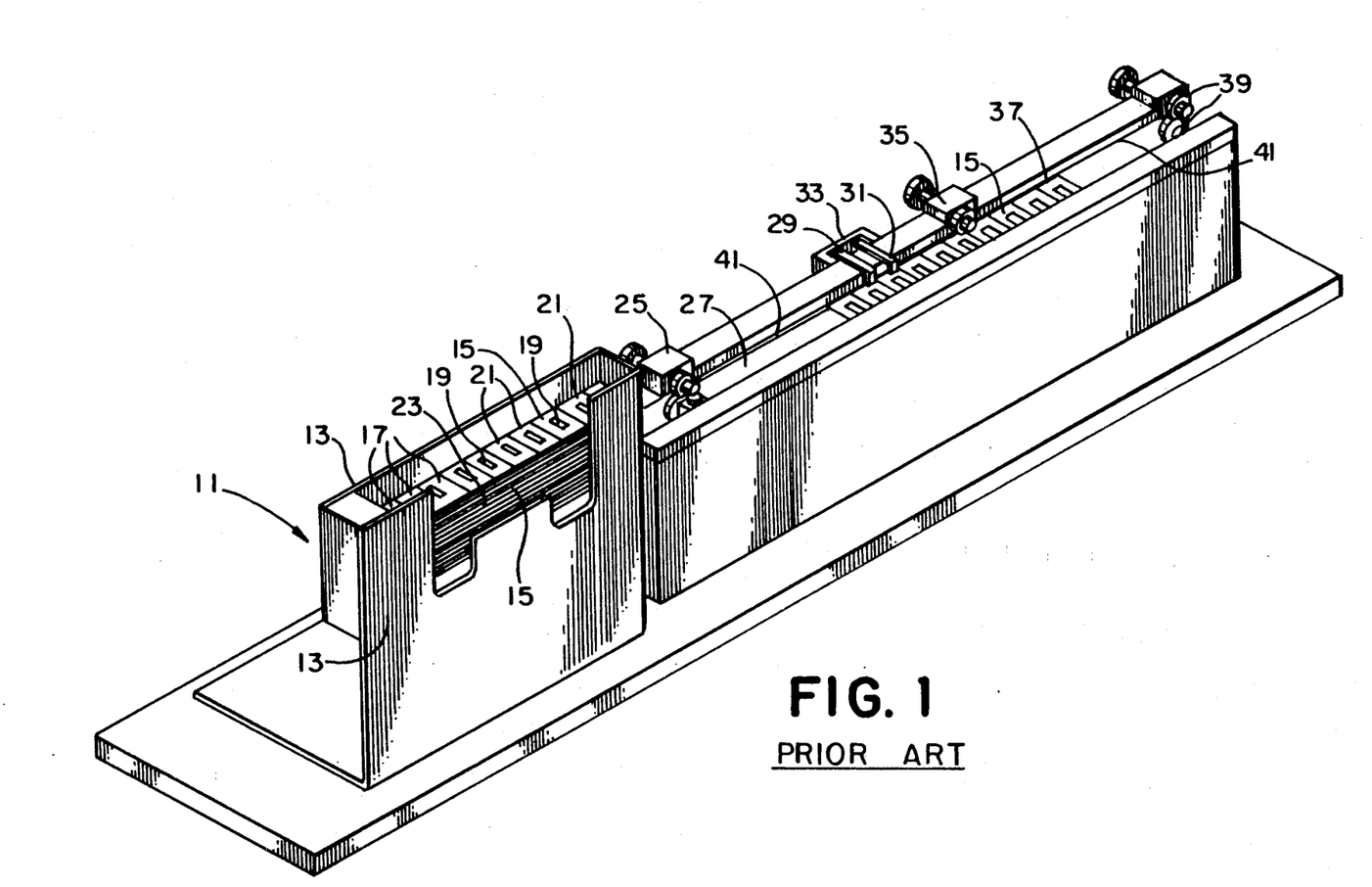
FIG. 1 is a view in three dimensions of a conventional lead frame workholder and transport apparatus in a die bonding machine, looking at the front of the machine.
Figure 1A:
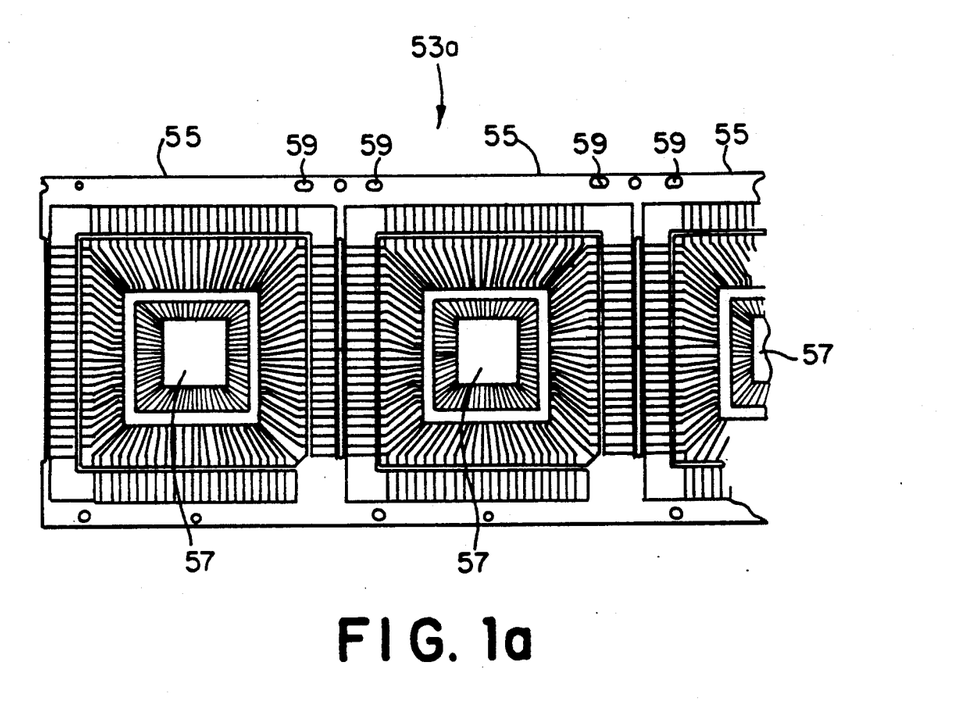
FIG. 1a is a view in top plan of a strip of 5 lead frames.
Figure 1B:
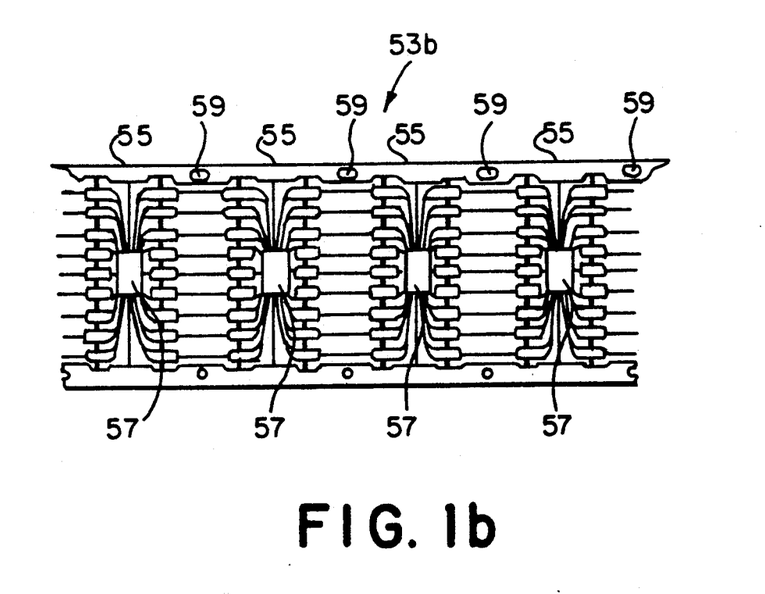
FIG. 1b is a view in top plan of a strip of 10 lead frames.

Referring to FIG. 1, which is illustrative of a conventional lead frame workholder, there is shown a workholder 11 which has a lead frame input carrier 13 that holds a stack of lead frame strips 15 each of which includes a number of lead frames 17, with this particular lead frame strip 15 showing 10 lead frames 17.

Each lead frame 17 has a centrally located bond or die pad 19 on which a die is to be mounted, and each lead frame 17 also has a locating pin hole 21 which is used to locate the lead frame 17 in the correct position at the epoxy and bond stations.

The distance between adjacent die pads 19 is referred to as the pitch between pads, and the pitch may be measured from the center line of one pad to the center line of the adjacent pad.

Input carrier 13 is provided with a lead frame separator 23 which separates the lead frame strips 15 in the stack.

Each lead frame strip 15 is fed separately through feed pinch rollers 25 along a track 27 to a clamp bar 29 and alignment pin 31 at the epoxy station 33 where an epoxy layer is applied to each die pad 19.

The epoxied lead frame strip 15 is then moved forwardly by pinch rolls 35 to a die bonding station 37 where a die or chip is attached to the epoxy layer.

Exit pinch feed rollers 39 move the die bonded lead frame strip 15 out of the machine and into an exit carrier.

During the passage of the lead frame strip 15 through the machine, it is guided by lead frame groove 41 in the far side wall of the track 27.

Conventional workholder 11 has a number of problems. The pinch rollers 25, 35, 39 may bend the lead frame strips 15 which are rather delicately constructed and must maintain their flatness in order to avoid problems in further assembly and packaging steps.

Also, in resetting the conventional workholder 11 for lead frame strips of another size, a great number of parts must be removed and replaced by parts which fit the size of the ne lead frame strip. The production down time while making this changeover is substantial, and can cost a great deal of money. The longer the down time the less production there is and the bigger the cost. If there must be a changeover four times a day, the cost of the down time becomes very significant.

SUMMARY OF THE INVENTION

It is an object of this invention to provide a lead frame workholder and transfer apparatus which may be changed over quickly from one size lead frame strip to another so as to avoid costly down time.

It is another object to provide a workholder track which is adjustable sideways, and to provide transport means which is easily adjustable for lead frame strips of different sizes.

Still another object is to provide a method of using the apparatus, such as for applying a layer of epoxy to the pads of the lead frames.

DETAILED DESCRIPTION

Referring to (FIGS. 2-9) of the drawings, there is shown a lead frame workholder and transport apparatus 51 for holding and transporting a strip 53, 53a, 53b of lead frames 55 from one station to another in, for example, a die bonding machine. The lead frames 55 and lead frame strips 53, 53a, 53b are conventional, and each lead frame 55 has a pad 57 and a locating pin hole 59. The lead frame strips 53 in the figures are shown diagrammatically for clarity.

Figure 2:
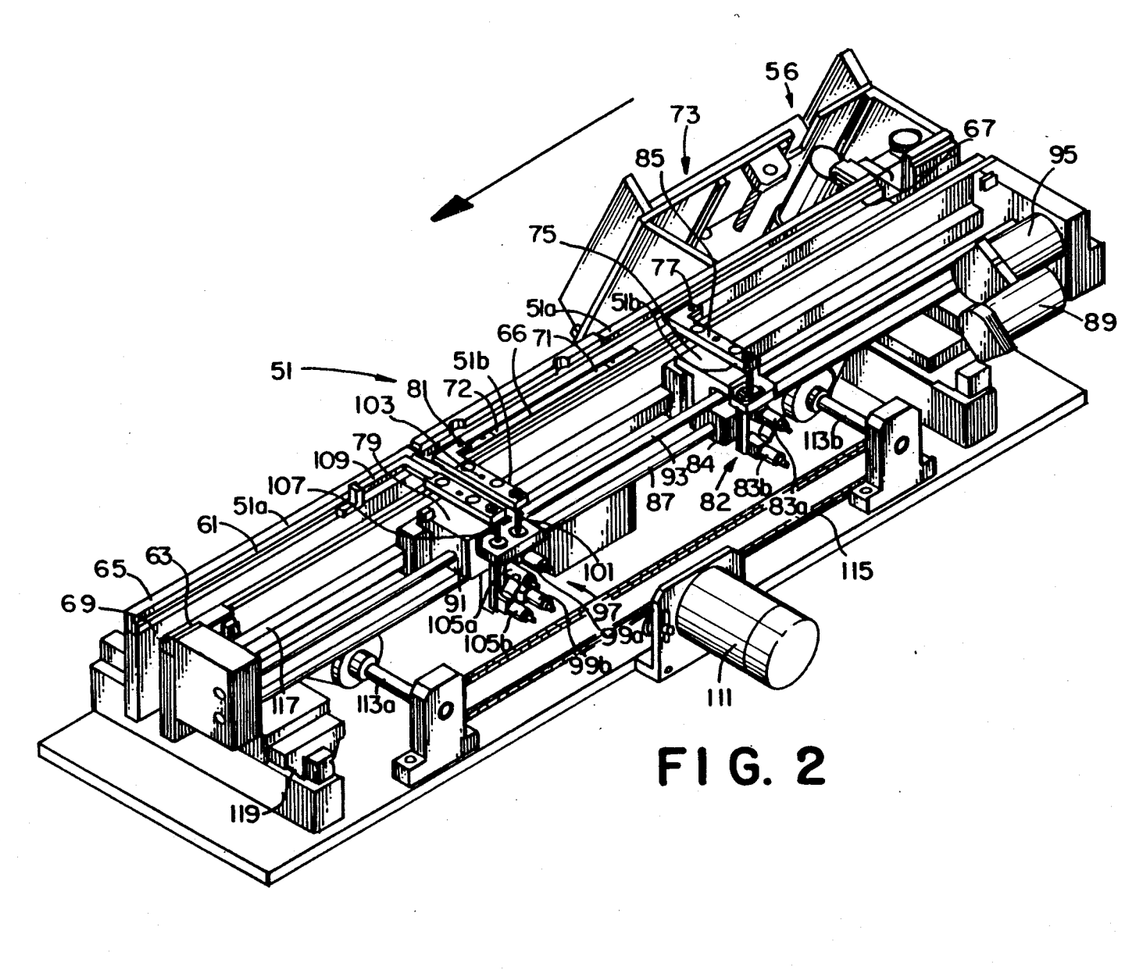
FIG. 2 is a three dimensional view of a lead frame workholder and apparatus, constructed in accordance with the invention, looking from the left rear of the machine.
Figure 3:
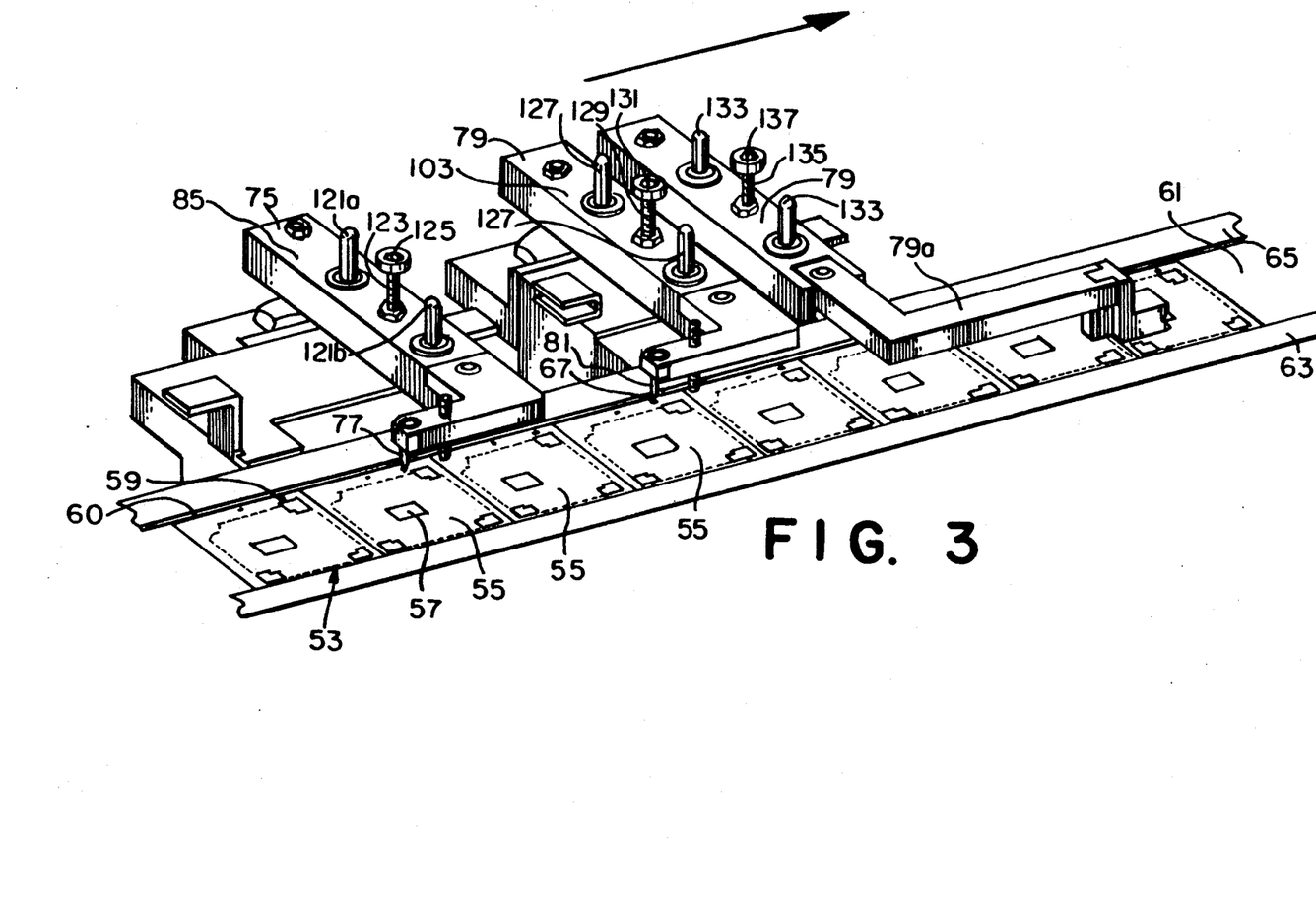
FIG. 3 is a three dimensional view of the transport apparatus of FIG. 2.
Figure 8:
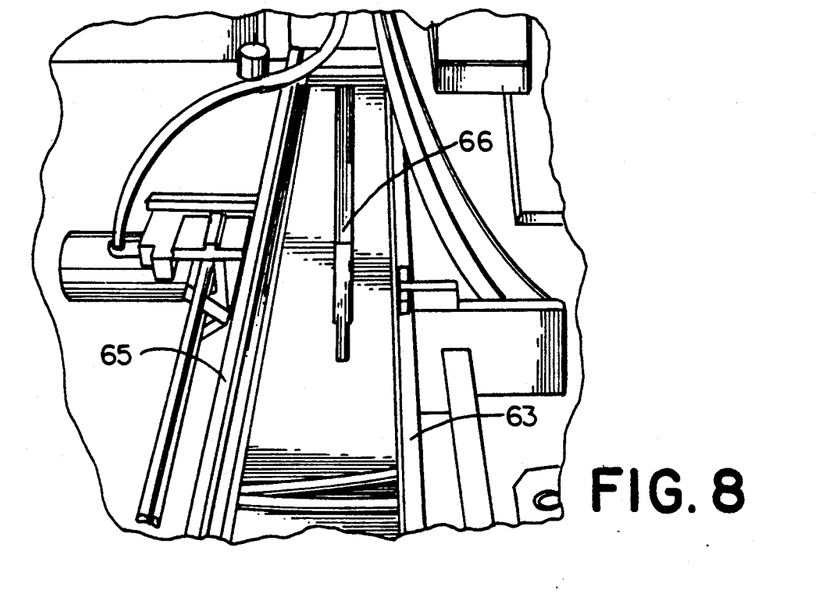
FIG. 8 is a view in three dimensions looking from the input end of the machine at an anvil which forms a part of the machine.

Workholder 51a includes a track 61 which has a near rail 63 and a far rail 65 which straddle an anvil 66 that is used to support a lead frame 55 when an epoxy layer is being applied to it and when a die or chip is being applied to the epoxy layer. Track 61 starts at an input station 67 and ends at an output or exit station 69, and has an epoxy application station 71 and a die bonding station 72 positioned between the input station 67 and the output station 69.

At input station 67, a loader means 73 is provided for loading strips 53 onto track 61 at input station 67.

A first transporter 75 is provided for contacting a lead frame strip 53 when it is positioned in the input station 67. First transporter 75 contacts strip 53 by inserting a pin 77 into a locating pin hole 59 of a frame 55. First transporter 75 then moves the strip 53 along the track 61 to the application station 71.

First transporter 75 preferably injects its pin 77 into a pin hole 59 located in about the middle portion of the strip 53 in order to minimize any wiggling motion from side to side of the strip 53 as it is being transported forwardly along the track 61 toward the exit end 69 of the track 61.

A second transporter 79 is provided for moving the lead frame strip 53 from the epoxy application station 71 toward output station 69, and this is accomplished by inserting a pin 81 from second transporter 79 into a locating pin hole of strip 53 which is not occupied by the pin 77 of the first transporter 75. The first pin 77 is released from the pin hole 59, and the second transporter 79 moves the strip 53 forwardly along track 61 toward the exit end of the track, and the first transporter 75 returns to the input station 67 to contact and transport the next strip 53 which is deposited in input station 67.

When the second transporter 79 has moved the strip 53 to the exit end of track 61, second transporter 79 releases the strip 53 by removing its pin 81 from pin hole 67. Second transporter 79 then moves rearwardly to the rear end of the lead frame strip 53, drops its pusher arm 79a to contact the rear end of the strip 53, and then second transporter 79 moves forwardly again to push the now die bonded strip 53 through the rear end of track 61 and into an output carrier which collects a number of strips 53. When the output carrier is filled with die bonded strips 53, it is taken elsewhere for further processing of the strips 53.

The transporter apparatus 51b is provided with release means 82 which include air cylinders 83a and 83b mounted on a base 84 of first transporter 75. The air cylinders 83a, 83b control the raising and lowering of arm 85 and thus the raising and lowering of the pin 77. Base 84 is mounted on lower lead screw 87 that is rotated by lower transport motor 89 to move the first transporter 75 back and forth in the track 61.

Second transporter means 79 comprises a base or body 91 which i mounted on a lead screw 93 that is rotated by a second or upper motor 95 to move second transporter 79 back and forth in the track 61.

A pin contact and release means 97 is provided for raising and lowering second transporter pin 81 into and out of locating pin holes 59 which comprises upper and lower air cylinders 99a, 99b which operate to raise and lower a shaft 101 that raises and lowers a pin arm 103 that has pin 81 mounted on its free end.

Body 91 of second transporter 79 also has mounted on it upper and lower air cylinders 105a, 105b which control the raising and lowering of a shaft 107 which raises and lowers a pusher arm 109 that is lowered behind a strip 53 positioned in the output station 69 of track 61 and then used to push the die bonded strip 53 out of the output station 69 into an output carrier.

To adjust the position of the rails 63, 65 in the Y axis, a Y axis motor 111 is provided that is connected to Y axis lead screws 113a and 113b by a chain drive 115.

Anvil 66 is positioned between rails 63 and 65 at the epoxy station 71 and the die bonding station 72, and the anvil 66 supports the pads of lead frames 55 as the epoxy is being applied to the pad and as the die is being applied to the epoxy. Strips 53 are relatively thin and fragile and it is important to keep strips 53 in their original condition without bending or twisting so a not to interfere with the die bonding and other assembly and packaging procedures which follow.

A linear ball guide 117 is provided for easier moving of the first transporter 75 and the second transporter 79 in the X direction, and another linear ball guide 119 is provided for moving the rails 63, 65 toward and away from each other in the Y direction when adjusting for different size strips 53.

Pin arm 85 of first transporter 75 is provided with vertical guide rods 121a, 121b and a threaded shaft 123 with an adjustable stop nut 125. Similarly, pin arm 103 of second transporter 79 is provided with vertical guide rods 127 and with a vertical screw shaft 129 having an adjustable stop nut 131. Also, second transporter 79 and its pusher arm 79a are provided with vertical guide rods 133 and a vertical threaded shaft 135 having an adjustable stop nut 137.

Figure 4:
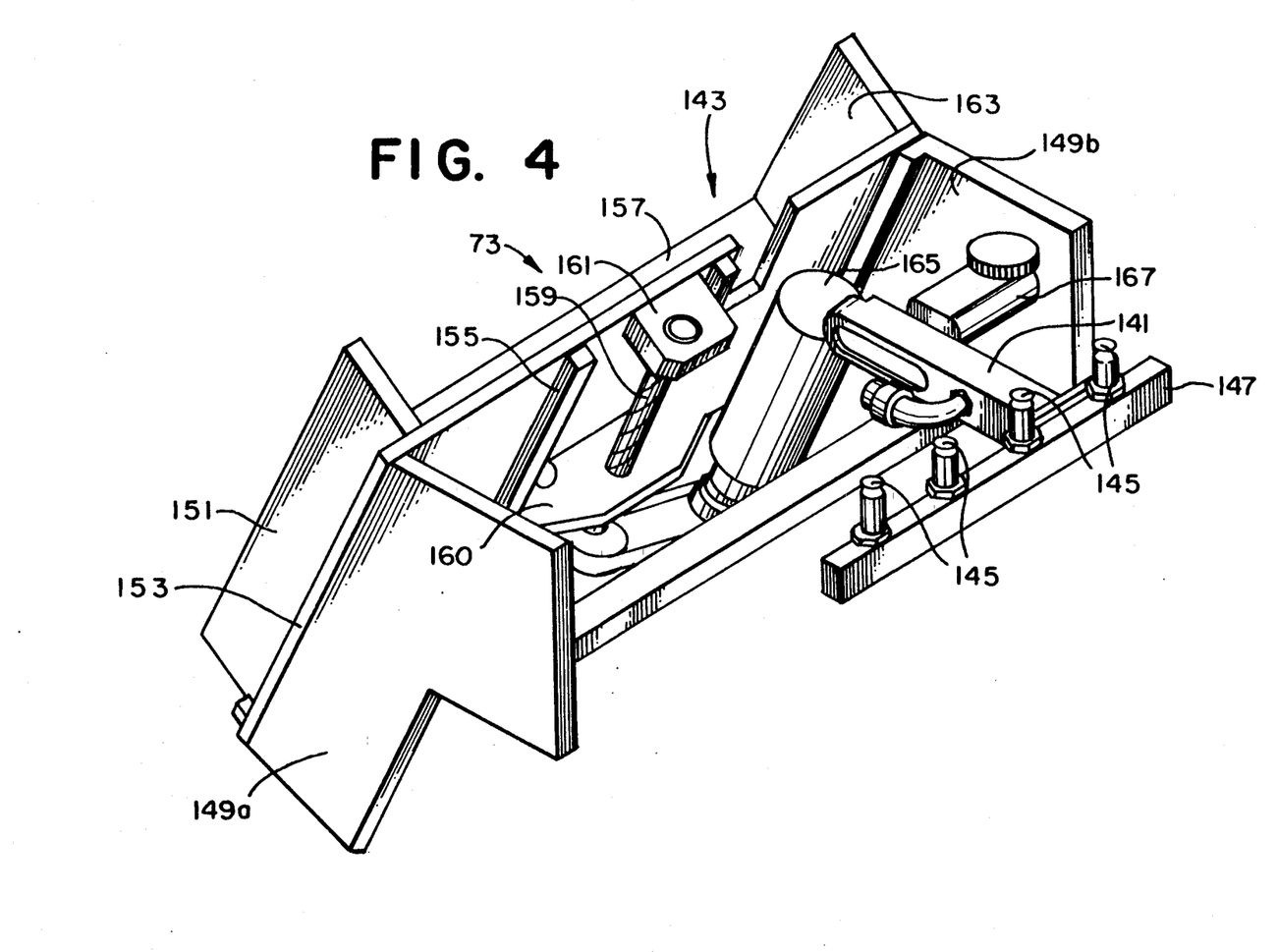
FIG. 4 is a three dimensional view of the input loader of FIG. 4, looking from the left rear of the machine.
Figure 5:
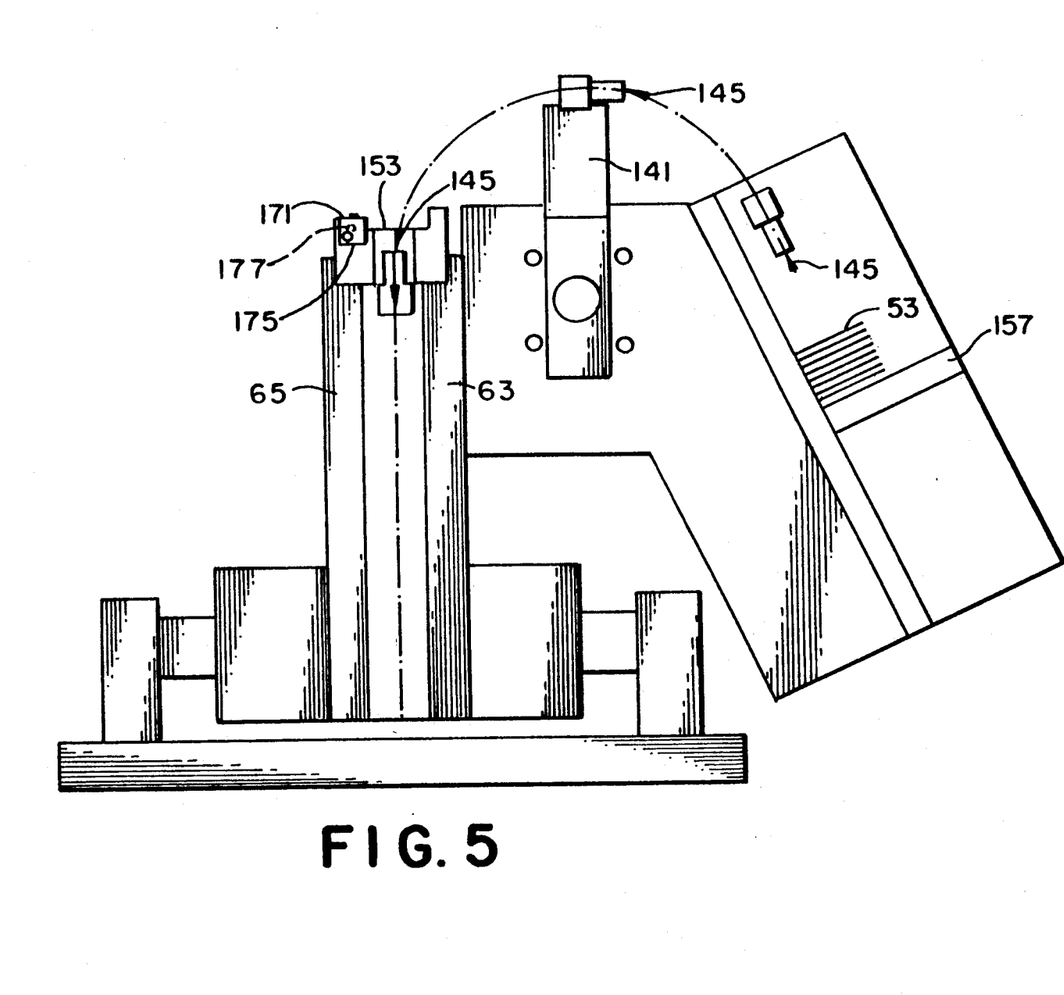
FIG. 5 is a view in end elevation of the input loader, looking from the left end of the machine.

Referring now to the loader 73 which is shown more particularly in FIGS. 4 and 5, the loader 73 comprises a vacuum arm 141 for picking up a strip 53 from a stack of face-down strips 53 in an input carrier 143 and delivering the strip face-up onto the track 61. Vacuum cups 145 are mounted on the cross arm 147 of vacuum arm 141 for picking up the top strip 53 of the stack and delivering it face-up onto track 61 at the input station 67.

Figure 6:
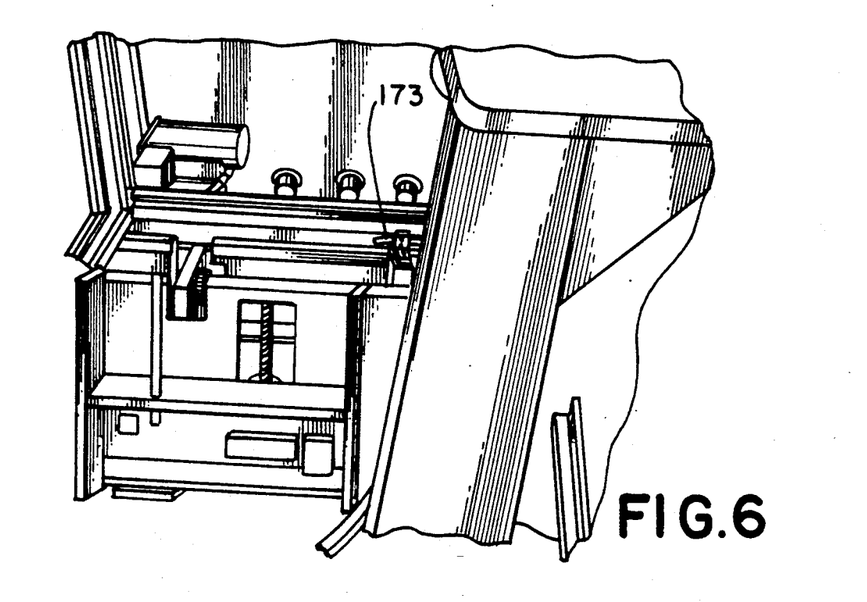
FIG. 6 is a view in three dimensions of the input loader, looking from the left front of the machine.

Loader 73 is provided with bracket slides 149a, 149b, an adjustable guide 151 which is adjustable sideways so as to accommodate strips 53 of different lengths, a base slide 153, a linear way 155, and a moving plate 157.

Moving plate 157 is an elevator plate that is moved upwardly as the stack of strips 53 grows shorter. To accomplish this, a lead screw 159 is mounted on a movable plate holder 160 and in bearing block 161. An adjustable plate 163 is mounted at the other end of elevator plate 157, and the elevator is operated by a motor 165. Vacuum arm 141 is rotatably mounted on a connecting block 167 that is actuated by a motor.

Figure 7:
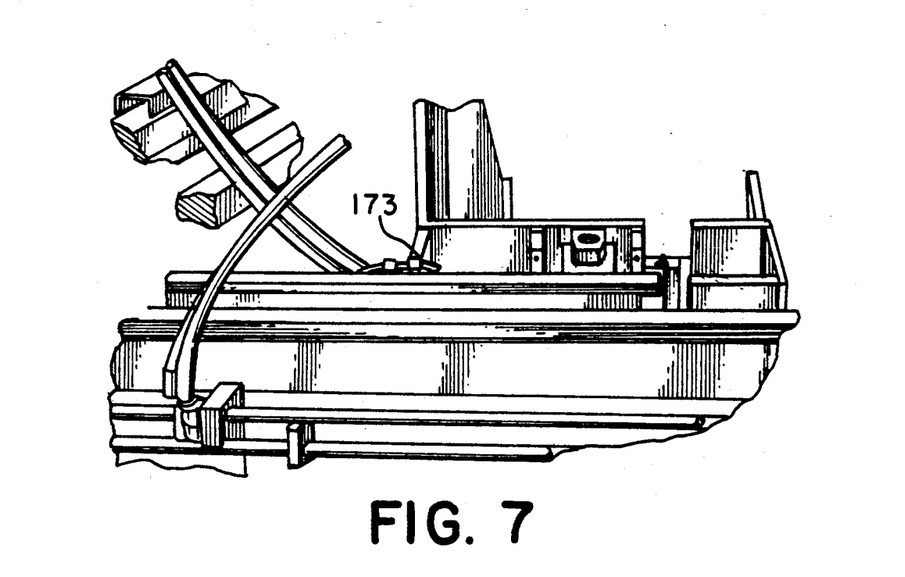
FIG. 7 is a view in three dimensions showing the input station looking from the rear of the machine and shows the air nozzle used in positioning a lead frame strip in the input station at the start of the workholder apparatus.
Figure 9:
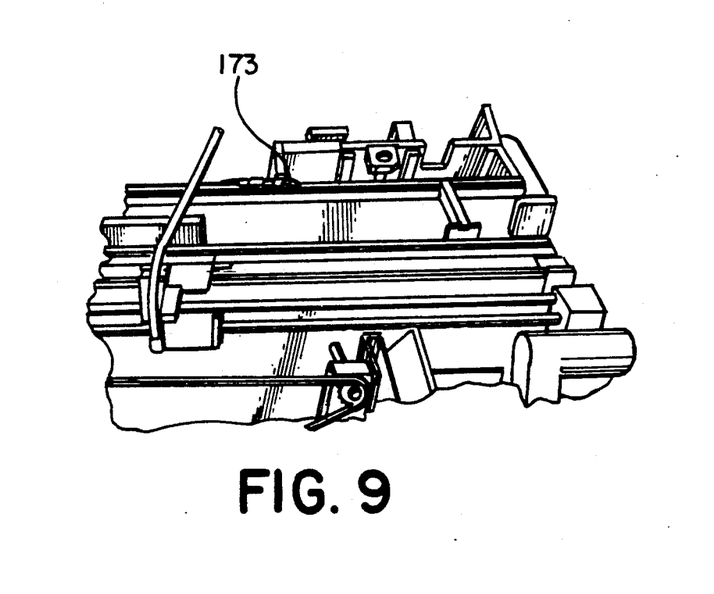
FIG. 9 is a view looking from the rear of the input station and shows the air nozzle.

A stop plate 171 is mounted on the end of rail 65 and is contacted by the trailing edge of the lead frame strip 53 when it is positioned in the input station 67 of the workholder 51a. This assures that the initial position of the strip 53 is correct so that it meshes properly with the rails 63, 65 and with the transporters 75 and 79, and with the pins 77 and 81 of the transporters. To assure that the lead frame strip 53 assumes this correct starting position, an air nozzle 173 is aimed at the leading edge of the strip 53 so as to push the lead frame 53 into the correct starting position.

The setting up of the rails 63, 65 and the position and operation of the transporters 75, 79 are controlled by computer software.

All the operator need do is to tell the computer the type and size of strip that the machine is to die bond, and the computer automatically tells the machine how to set up and where to position the rails 63, 65 and the transporters 75, 79.

The computer also tells the transporters 75, 79 how to operate, when to pick up a strip 53 from the input station 67, how far to advance the lead frame, when to stop movement of the lead frame and apply the epoxy layer, when to release the lead frame and return to the input station 67 for another lead frame, when to pick up the advancing lead frame with the second transporter 79, how to advance it during the die attach operation, when and how to advance it to the output station 69, when and how to push the strip 53 from the output station 69 into an output carrier, and when to return the second transporter 79 to pick up and control the movement of a following strip 53.

In operation, the method of the invention is to load a number of strips 53 face-down in a stack in input loader 73, with each strip 53 comprising a number of lead frames 55 each having a pad 57 and a locating pin hole 59 near its far edge. The top lead frame strip 53 is picked up from the stack by a vacuum arm 141 which deposits the strip 53 face-up onto track 61 which has an L-shaped near rail 63 and an L-shaped far rail 65. The strip 53 is pushed into correct starting position in input station 6 by a jet of air from air nozzle 173. The jet of air impinges against the leading edge of the strip 53 and forces it backwardly against stop plate 171.

When in correct starting position, strip 53 is contacted by inserting a pusher pin 77 from first transporter 75 into a locating pin hole 59 of one of the lead frames 55 in the strip 53.

First transporter 75 moves the strip 53 forwardly in the track 61 with pin 77 riding along in a bottom groove in the top surface of rail 65.

The strip 53 is moved forwardly in the track 61 by the first transporter 75 and its pin 77 until the lead frame strip 53 is positioned at an epoxy resin application station 71 where a layer of epoxy resin is applied to the pads 57 of the lead frames 55 in succession. As the strip 53 advances, the first transporter 75 releases the strip 53 by raising the pin 77 from the locating pin hole 99 by operating the air cylinders 83a and 83b. Before the first transporter 75 is returned to the input station 67, the strip 53 is contacted by second transporter 79 as its pin 81 is inserted into the locating pin hole 59 in another lead frame 55 of the strip 53.

The first transporter 75 is then returned to the input station 67 to pick up another strip 53. The first strip 53 is moved to the exit or output station 69, and then the second transporter 79 moves rearwardly to the trailing end of strip 53, drops its pusher arm 109 and pushes the lead frame strip 53 out of the output station 69 into an exit or output carrier.

The air nozzle 173 not only pushes the strip 53 against the stop plate 171, but the jet of air from the air nozzle 173 also pushes the far edge of the strip 53 into a guide groove in the upright vertical leg of the L-shaped far rail 65.

We claim:

1. Lead frame workholder and transport apparatus (51) for holding and transporting a strip (53) of lead frames (55) from one station to another,
    each lead frame (55) having a pad (57) and a locating pin hole (59), comprising
    a track (61) having a near rail (63) and a far rail (65) with an input station (67) at one end and an output station (69) at the other end with an application station (71) in between,
    loader means (73) for loading a strip (53) of lead frames (55) into the input station (67),
    a first transport means (75) for contacting the lead frame strip (53) in the input station (67) by inserting a pin (77) into a locating pin hole (59) and moving the strip (57) along the track (61) to the application station (71),
    a first drive means (89) for driving the first transport means from the input station to the application station and for returning said first transport means to the input station to engage another strip and move it to the application station,
    a first release means (82) for releasing the first transport means (75) from the strip (53) at the application station so that the first transport means can be moved back to the input station,
    a second transport means (79) which is separate from the first transport means for moving the strip (53) from the application station (71) toward the output station (69) by inserting a pin (81) in an open locating pin hole (59) of the strip (53), said open locating pin hole 59 being one that is not occupied by said pin (77) of the first transport means (75),
    a second drive means (95) for driving the second transport means from the application station toward the exit end of the track, and for returning said second transport means to the application station to engage another strip,
    and a second release means (97) for releasing the second transport means (79) from the strip (53) so that the second transport means can return to the application station.

2. The apparatus of claim 1,
    said first release means (82) comprising an air cylinder (83a, 83b) on the first transport means (75) which lifts a pin arm (85) which raises pin (77) out of locating pin hole (59),
    said first drive means (82) including a lead screw (87) on which the base (84) of the first transport means (75) is mounted and driven by a motor (89).

3. Lead frame workholder and transport apparatus (51) for holding and transporting a strip (53) of lead frames (55) from one station to another,
    each lead frame (55) having a pad (57) and a locating pin hole (59), comprising
    a track (61) having a near rail (63) and a far rail (65) with an input station (67) at one end and an output station (69) at the other end with an application station (71) in between,
    loader means (73) for loading a strip (53) of lead frames (55) into the input station (67),
    and a first transport means (75) for contacting the lead frame strip (53) in the input station (67) by inserting a pin (77) into a locating pin hole (59) and moving the strip (57) along the track (61) to the application station (71),
    said loader means (73) comprising a vacuum arm (141) for picking up a strip (53) from a stack of face-down strips (53) in an input carrier (143) and delivering the strip (53) face-up onto the track (61).

4. Lead frame workholder and transport apparatus (51) for holding and transporting a strip (53) of lead frames (55) from one station to another,
    each lead frame (55) having a pad (57) and a locating pin hole (59), comprising a track (61) having a near rail (63) and a far rail (65) with an input station (67) at one end and an output station (69) at the other end with an application station (71) in between, loader means (73) for loading a strip (53) of lead frames (55) into the input station (67), and a first transport means (75) for contacting the lead frame strip (53) in the input station (67) by inserting a pin (77) into a locating pin hole (59) and moving the strip (57) along the track (61) to the application station (71), release means for releasing the first transport means (75) from the strip (53), and return means for returning said first trasnport means (75) to the input station (67) to engage another strip (53) and move it to the application station (71), said input loader means (73) further including vacuum cup means (145) on the end cross arm (147) of the vacuum arm (141) for picking up the top strip (53) of the stack and delivering it to the track (61).

5. Lead frame workholder and transport apparatus (51) for holding and transporting a strip (53) of lead frames (55) from one station to another, each lead frame (55) having a pad (57) and a locating pin hole (59), comprising a track (61) having a near rail (63) and a far rail (65) with an input station (67) at one end and an output station (69) at the other end with an application station (71) in between, loader means (73) for loading a strip (53) of lead frames (55) into the input station (67), and a first transport means (75) for contacting the lead frame strip (53) in the input station (67) by inserting a pin (77) into a locating pin hole (59) and moving the strip (57) along the track (61) to the application station (71), including air nozzle means (101) mounted on the track (61) which directs air against the front near corner (103) of the strip (53) to move the rear edge (105) and far edge (107) of the strip into proper position for inserting the pin (77) into a selected locating pin hole (59) of the strip (53).

6. The apparatus of claim 1, including pusher arm means (103) mounted on the second transport means (79) for pushing the lead frame strip (53) out of the application station (71) into an output carrier.

7. A method of applying an epoxy layer to the pads of a strip of lead frames, each lead frame having a pad and a locating pin hole near its far edge, comprising the steps of loading a number of lead frame strips face-down in a stack in an input loader, picking up the top lead frame strip from the stack with a vacuum arm and depositing the strip face-up onto a track having an L-shaped near rail and an L-shaped far rail, contacting the strip by inserting a pin from a first transport means into a locating pin hole, sliding the pin a bottom groove in the L-shaped far rail, moving the strip forwardly in the track by moving the first transport means and its pin until the lead frame strip is positioned under an epoxy resin application station, applying a layer of epoxy resin to the pads of a number of lead frames, releasing the first transport means from the strip and returning it to the input station to contact another strip, moving the first lead frame strip by means of a second transport means to an exit station.

8. The method of claim 7, including the step of positioning the strip in the input station by applying an air stream from a nozzle onto the leading edge of the strip to push the strip rearwardly against an end stop and to push the far edge of the strip into a guide groove in an upright leg in an L-shaped far rail of the track.

* * * * *